United States Patent [19]

Clarke et al.

[11] Patent Number: 5,264,786
[45] Date of Patent: Nov. 23, 1993

[54] ELECTRICAL DEVICE FOR MEASURING ELECTRICAL PARAMETERS

[75] Inventors: David J. Clarke, Bramford, Great Britain; Bernard Patry, Orsay; Alain Chiffert, Massy, both of France; Alain Carnel, Poitiers, France

[73] Assignee: Schlumberger Industries, Montrouge, France

[21] Appl. No.: 790,057

[22] Filed: Nov. 12, 1991

[30] Foreign Application Priority Data

Dec. 7, 1990 [FR] France .................................. 90 15332

[51] Int. Cl.[5] ............................................. G01R 35/04
[52] U.S. Cl. ........................................ 324/142; 324/74
[58] Field of Search ............... 324/142, 103 R, 117 R, 324/74; 364/483, 481, 551.01, 571.01; 340/635, 637, 661

[56] References Cited

U.S. PATENT DOCUMENTS 4,646,003 2/1987 Phillips et al. ........................ 324/74
4,758,774 7/1988 Crawford et al. .................. 324/142

FOREIGN PATENT DOCUMENTS 1603648 11/1981 United Kingdom.

*Primary Examiner*—Vinh Nguyen
*Attorney, Agent, or Firm*—Sanford J. Asman

[57] ABSTRACT

An electrical measuring device utilizing a shunt, an electronic measuring circuit floating at the potential of the shunt and a first voltage divider connected between the shunt and a neutral point to provide a first voltage signal to the circuit. To obtain the benefit of decoupling the potential between the shunt and the intermediate point of the first voltage divider, the device includes an additional terminal connected to the shunt by a second voltage divider, whose intermediate point supplies a second voltage signal used differentially with the first.

8 Claims, 2 Drawing Sheets

5,264,786

ELECTRICAL DEVICE FOR MEASURING ELECTRICAL PARAMETERS

The present invention relates to an electrical measuring device comprising:

at least N+1 connection terminals whose potentials define, in operation, at least N control voltages, N being an integer at least equal to one;

an electronic measuring circuit comprising at least N+1 input terminals whose potentials define for the circuit, in operation, at least N counterpart voltages representing the corresponding control voltages, this circuit using a reference potential linked to the potential of the first connection terminal; and a first voltage divider between the first and second connection terminals, with a first intermediate point connected to the second input terminal of the measuring circuit, and providing a determined voltage ratio.

BACKGROUND OF THE INVENTION

A device of this type is described in British Patent GB 1 603 648, in the form of an electronic meter for measuring electrical power, having connection terminals for connection to an electrical power network and which includes a power measuring circuit constituted by an integrated circuit whose input terminals are connected to said connection terminals.

As shown in the figures of that patent relating to its various modes of connection, such a meter clearly has to be adapted to the type of power network in which it is to be connected.

In general, devices including electronic circuits for measuring one or more electrical parameters are traditionally designed to operate in only one mode of connection and run the risk, if they are used in any other way, of providing no signal, or only giving false measurements, or even being destroyed.

A problem arises in particular when a device of the type defined in the introduction needs to be capable of connection to an electrical network equally well by N+1 connection terminals or N+2 connection terminals, that is to say with possible use of an additional connection terminal, when the first terminal and the additional terminal can either be at the same potential or at two different potentials, whose difference represents a parasitic voltage, and when nevertheless the measuring circuit should not make any significant response to such a parasitic voltage.

In this context the present invention has as its main object the provision of a solution to this first problem.

SUMMARY OF THE INVENTION f To this end the device of the invention comprises, in addition to the elements set forth in the introduction:

an additional connection terminal, adapted to be raised selectively to the potential of the first connection terminal or to a different potential, an additional input terminal co-operating with the second input terminal of the measuring circuit to form a differential input for this circuit, and a second voltage divider between the first connection terminal and the additional connection terminal, with a second intermediate point connected to the additional input terminal of the measuring circuit and providing a voltage ratio substantially equal to the ratio provided by the first divider, the voltage defined between the second input terminal and the additional input terminal thus being substantially representative of the voltage between the second connection terminal and the additional connection terminal, whether this is raised to the s&ne potential as the first connection terminal or not.

In the case in which at least two connection terminals, including the first connection terminal but not the additional connection terminal, define at least one voltage representing the current flowing through a shunt, this device advantageously includes a power supply transformer, whose primary is connected between the additional connection terminal and the second connection terminal and whose secondary is connected by a DC connection to the first connection terminal.

By virtue of this arrangement it is possible to feed a plurality of measurement devices on one test bench from the energy available between two of the connection terminals of each of these devices, without thereby appreciably disturbing the currents flowing in their respective shunts, whether or not the additional connection terminal of each device is raised to the same potential as the first connection terminal.

The device of the invention is particularly suited to the case in which the measuring circuit is an electrical power or energy measuring circuit and in which the device is intended to be installed in an electrical power network comprising a neutral conductor and at least one phase conductor, the first and second connection terminals then being advantageously raised, in operation, to the respective potentials of the phase and neutral conductors.

In this case it is additionally preferable for the connection terminals that are raised to the potentials whose difference is representative of the current flowing in the shunt to be the first and third terminals.

Furthermore the series impedance of the first voltage divider is preferably not less than 500 kohms and the ratio of the series impedance of the first voltage divider to that of the second voltage divider is preferably not less than unity.

Finally, the advantages aimed at by the invention are realized all the better if the ratio is close to a fixed, predetermined value, in other words is substantially the same from one to device to another.

BRIEF DESCRIPTION OF THE DRAWINGS

An of the invention is described by way of example with reference to the accompanying drawings, in which.

DETAILED DESCRIPTION

A conventional electro-mechanical, single-phase meter, such as CTa, CTb or CTn (FIG. 1) comprises a current coil, such as ECa, ECb or ECn and a voltage coil, such as ETa, ETb or ETn. Such a meter thus has the form of a four-pole network, i.e. a device having four connection terminals, such as 1a, 2a, 3a, 4a, 1b, 2b, 3b, 4b, etc.

In conventional manner, the meters are tested in batches on benches provided with a source of current I and a source of voltage V, the current coils of a plurality of these meters being connected in series with the current source and the corresponding voltage windings being connected in parallel to the voltage source.

Providing that the current and voltage sources of the test bench are of adequate capacity, this technique offers the best reliability in metrological terms, since all the current coils of all the meters carry the same current and, at the same time, all the voltage coils of these meters are subjected to the same potential.

Nevertheless, this technique assumes that the terminals such as 1a and 4a of each meter can have independently varying potentials, failing which the meters are no longer subjected to the same current signals, this depending on the extent to which they are more or less remote from the current source.

Figure 2:
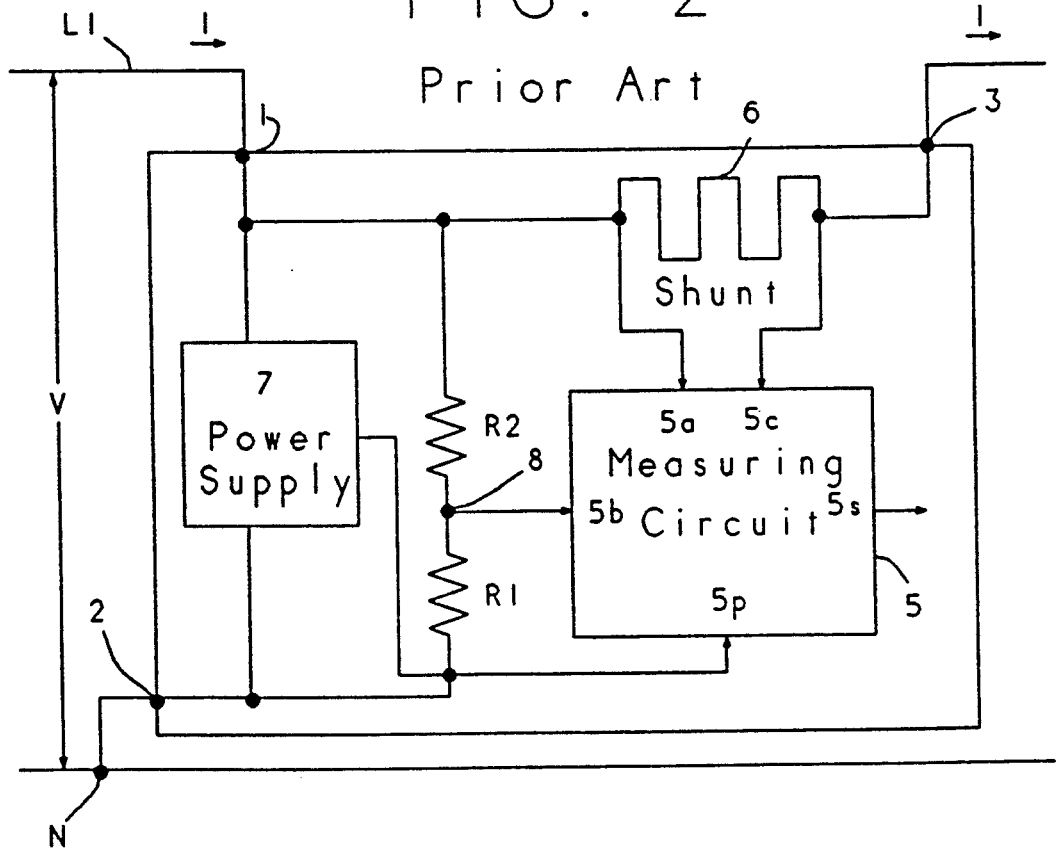
FIG. 2 is a circuit diagram showing an electronic power meter which can benefit from the advantages of the invention.

Such a constraint is in particular the cause of a problem which arises in testing a meter of the type shown in FIG. 2, without altering the test method or the bench used therefor, this meter being essentially constituted by a three-pole network, i.e. a device with only three connection terminals, such as 1, 2 and 3.

The meter of FIG. 2, described in detail in above-mentioned patent GB 1 603 648, and merely referred to here by way of example, comprises schematically an electronic circuit 5 for measuring power, a voltage divider R1, R2 between the first and second connection terminals 1 and 2, a shunt 6 connected between the first and third terminals 1 and 3, and an electrical power supply circuit 7, also connected between the first and second connection terminals 1 and 2. connection terminals (1,2) define a first control voltage there between, and a second control voltage is defined between the connection terminals (1,3). As additional connection terminals are added, they would define additional control voltages.

To operate this meter in the electrical power network, the second terminal 2 is connected to the neutral conductor N and the terminals 1 and 3 are connected to the live phase conductor L1, the shunt 6 thus carrying the current flowing along the conductor L1.

The voltage divider R1, R2 comprises two resistors R1 and R2 of unequal resistances, the larger R1 being connected to the second terminal 2.

In this manner, the intermediate point 8 formed by the common terminal of the resistors R1 and R2 is raised to a potential relatively near to that of the terminal 1, but with the difference that the common terminal potential is representative of the voltage between the terminals 1 and 2, in other words between the conductors L1 and N.

The measuring circuit 5 mainly comprises three measuring input terminals 5a, 5b, and 5c, respectively connected to the connection terminal 1, the intermediate point 8 and the terminal 3, with the voltage received by the circuit 5 between its terminals 5a and 5c thus being representative of the current flowing in the live conductor L1.

Furthermore the circuit includes at least one electrical power supply input 5p, connected to the output of the circuit 7, which supplies a substantially constant potential in relation to that of the first connection terminal 1.

The circuit 5, has available firstly a potential on its terminal 5a which may be used as a reference potential, secondly a voltage between its terminals 5a and 5b representing the voltage between the conductors L1 and N, and finally a voltage representing the current flowing in the conductor L1 between its terminals 5a and 5c, and is thus able to provide a signal on an output 5s representing the power or the energy conveyed by the conductors L1 and N.

Figure 1:
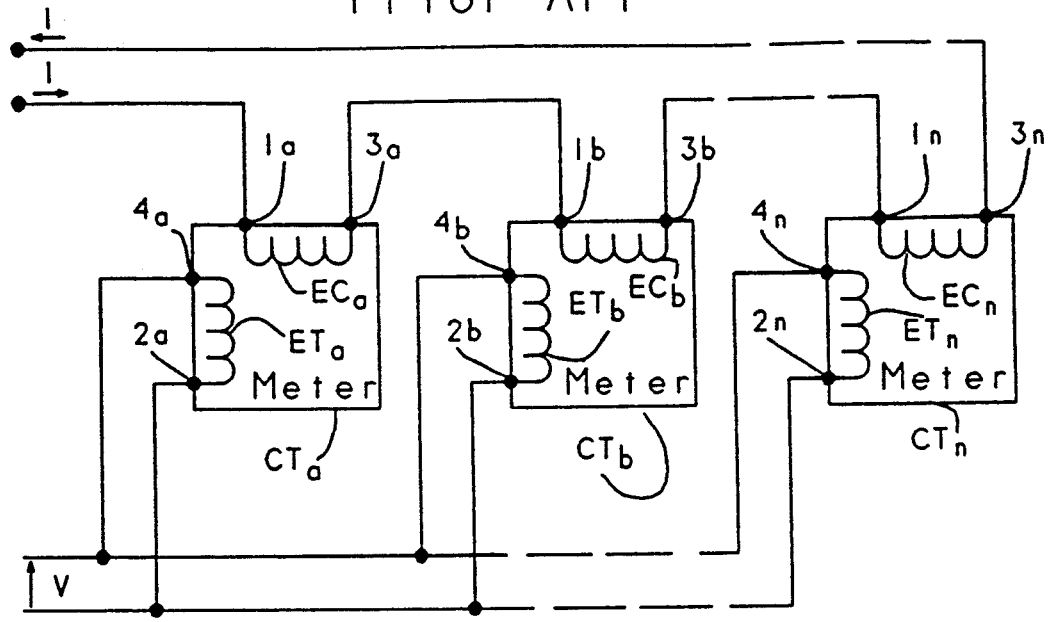
FIG. 1 is a circuit diagram showing a test bench for electro-mechanical electrical power meters.

Although such a meter has very many advantages in use, especially in relation to the prevention of fraud, it nevertheless poses a problem of connection to traditional test benches, which a comparison of FIGS. 1 and 2 immediately makes apparent.

Figure 3:
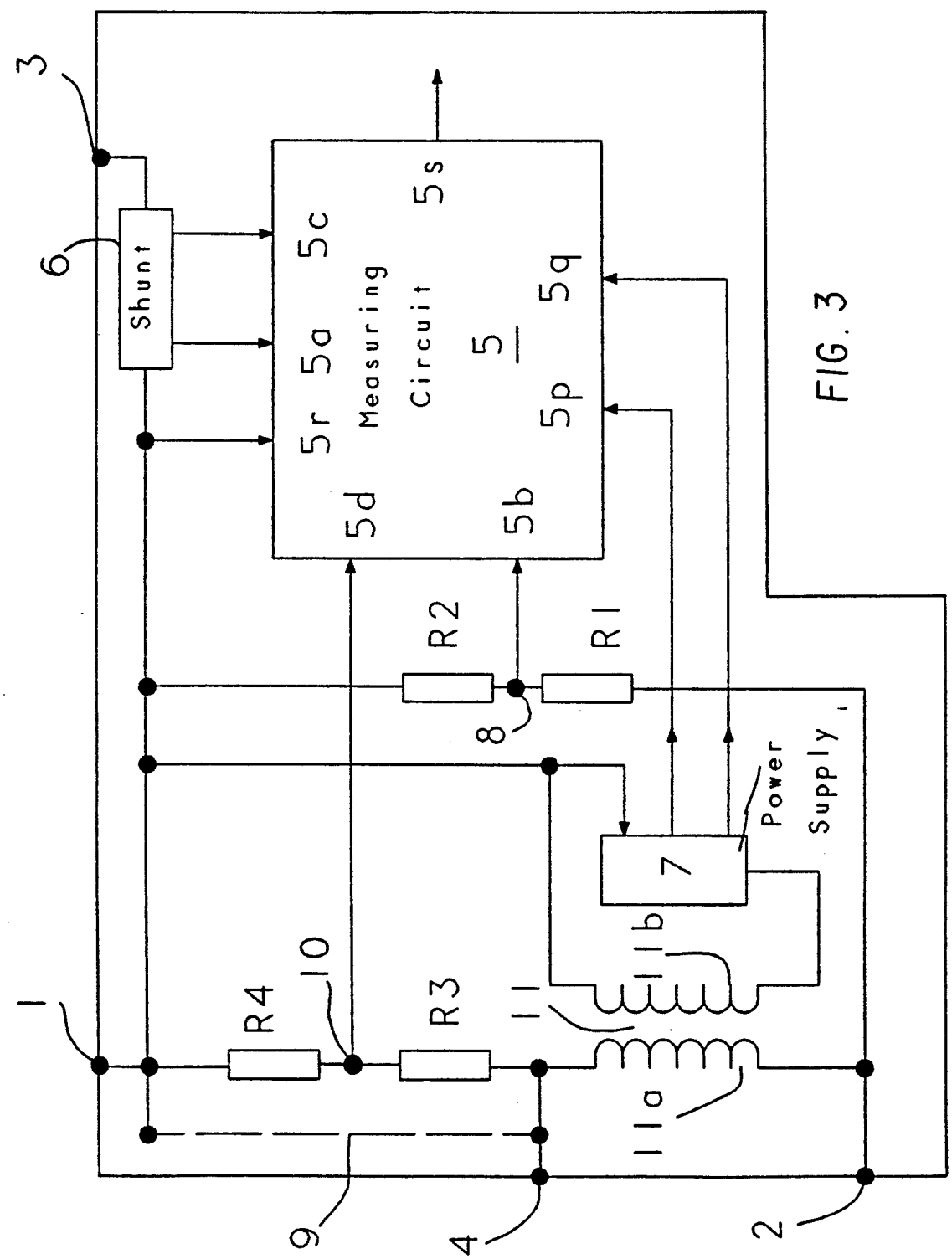
FIG. 3 is a circuit diagram showing a device in accordance with the invention.

FIG. 3 shows a set of features which the invention proposes to implement in order to resolve the problem identified in the introduction, as well as problems specifically related to electrical power metering and to the context of FIGS. 1 and 2.

For reasons of clarity, similar elements appearing in FIGS. 2 and 3 are designated by the same reference numerals.

As well as the elements described above with reference to FIG. 2, the device of FIG. 3 includes firstly an additional connection terminal 4, which can assume a potential different from that of the terminal 1 or, on the contrary can be raised to the same potential as the latter through a removable conductor 9 which optionally interconnects the connection terminals 1 and 4.

As will be understood better from the following description, the removable conductor 9, which can take the form of a simple screw, is removed while the meter is on the test bench and is replaced for installation of the meter in the electrical power network.

The measuring circuit 5 includes for its part an additional input terminal 5d co-operating with the second input terminal 5b to form a differential input for the measuring circuit.

The expression "differential input" as used here is chosen to indicate that the input terminals 5b and 5d are connected to high impedance inputs of a differential amplifier or at least to the symmetrical input stage with two transistors which characterizes such a amplifier, which may nevertheless already exist in the circuit 5, as is the case with the measuring circuit described in the British patent mentioned above.

The device of the invention further includes a second voltage divider R3, R4 between the first connection terminal and the additional connection terminal and comprising two resistors R3 and R4 of unequal resistances, of which the smaller, R4, is connected to the first connection terminal.

The intermediate point 10 constituted by the common terminal of the resistors R3 and R4 and connected to the additional input terminal 5d of the measuring circuit 5 is thus raised, in the absence of the conductor 9, to a potential relatively close to that of the terminal 1, but with a difference from the latter representative of the voltage between the terminals 1 and 4.

More particularly, the second voltage divider R3, R4 introduces a voltage ratio substantially equal to the ratio introduced by the first divider R1, R2, that is to say, the ratio R4/R3 is as close as possible to the ratio R2/R1 and is ideally equal thereto.

Under these conditions, and if the electrical potential of the terminal with the reference x is denoted Px, it can be shown that:

$$P_{5b} - P_{5d} = k(P_2 - P_4)$$

where $k = R2/(R1+R2) = R4/(R3+R4)$.

When the terminals 1 and 4 are interconnected by the conductor 9, it happens that the terminals 1 and 2, and thus the terminals 4 and 2, are kept apart by the first voltage divider and that calculation leads to the same expression.

In other words, the voltage applied to the differential input 5b, 5d of the measuring circuit 5 is thus a counterpart voltage representative of the voltage between the second connection terminal 2 and the additional connection terminal 4, regardless of whether the terminal 4 is raised to the same potential as the first connection terminal 1.

In a preferred, industrial embodiment of the invention, the first and third input terminals 5a and 5c of the measuring circuit 5 are in fact formed by intermediate terminals of the shunt 6, in which case it is obvious that they are not actually at the respective potentials of the connection terminals 1 and 3, but the voltage across the terminals 5a and 5c is still representative of the voltage across the terminals 1 and 3. As shown, in this embodiment the circuit 5 has a reference potential input terminal 5r, connected directly to the first connection terminal 1 and whose potential, very close to those of the terminals 5a and 5c, serves as an internal reference potential for the measuring circuit 5.

According to a very advantageous feature of the invention a device such as that of FIG. 3 can use a power supply transformer 11 to power the measuring circuit 5 from the power available between the conductors 1 and 2, the primary 11a of the transformer being connected between the additional connection terminal 4 and the second connection terminal 2, and its secondary 11b being connected to the first connection terminal 1 by a DC connection.

The idea of a "DC connection" as used here relates to two conductors whose electrical potentials are tied to one another and necessarily change in a coordinated manner, for example because these two conductors are connected to one another by a third, as is the case shown in the circuit diagram of FIG. 3.

The secondary 11b of the power supply transformer 11 is connected to a conventional AC-DC converter 7, utilizing a rectifier bridge and a low-pass filter and enabling a stable, bipolar direct voltage to be generated from the reference potential on the terminal 1 and the alternating voltage received on the secondary 11b, referenced to the potential of the first connection terminal 1 and which the converter 7 applies to corresponding power supply inputs 5p and 5q of the measuring circuit 5.

Very advantageously, the measuring transformers that are frequently used in the prior art to feed measuring circuits such as 5 with input signals on terminals such as 5a, 5c, 5b and 5d, are replaced by the transformer 11, which does not have to have any special metrological properties, nor any very great isolating quality, and which only serves to provide DC isolation between the first terminal 1 and the additional terminal 4 when the conductor 9 is removed, for the purpose of feeding the circuit 5 with a power supply voltage that stays referenced to the potential of the terminal 1.

Thus, as the person skilled in the art can verify on the basis of the foregoing description, the mean potential $(p_{5d}+P_{5b})/2$ present on the differential input of the circuit 5 is related to the potentials on the connection terminals 1, 2 and 4 by the equation:

$$(P_{5d}+P_{5b})/2=(1-k).(P_2+P_4)/2$$

from which:

$$P_{5d}+P_{5b}-2.P_1=k.(P_2+P_4-2.P_1)$$

In other words, the mean voltage level $(P_{5d}+P_{5b}-2.P_1)/2$ received at the differential input 5d, 5b of the circuit 5 is not only a function of the useful voltage $P_2-P_1$ but also of the parasitic voltage $P_4-P_1$ which may appear when the conductor 9 has been removed.

It is thus necessary a priori to take special steps to remedy the harmful effects of this voltage arising in common mode. However, experience shows that these steps are relatively simple.

In the first place, the differential amplifier to whose input stage the terminals 5b and 5d are connected should have sufficiently high common mode rejection. In fact common mode rejection in the order of 54 dB, corresponding to a ratio of 500/1, is sufficient to limit to a value of 0.1% the relative error created by a common mode signal V/2 superimposed on a differential signal V.

Moreover the ratios of the voltage dividers R1, R2 and R3, R4 should be matched so as to limit the discrepancy between these ratios and their theoretical value k. To this end, at least one of these dividers can be implemented in thick film technology so that it can be adjusted by laser trimming, the maximum relative error acceptable in these ratios being in the order of 0.2% for example.

In practice it is also advisable to give the series resistances R1+R2 and R3+R4 sufficiently high resistances to limit the load on the voltage source of the test bench, a resistance of 500 kohms for R1+R2 and/or R3+R4 being sufficient for operating voltages in the order of 250 volts.

Moreover the demands on common mode rejection can be reduced by giving the ratio R1/R3 (accordingly the ratio R2/R4 also) a value at least equal to unity.

Finally the advantages aimed at by the invention are realized the better if the ratio (R1+R2)/(R3+R4) is close to a fixed, predetermined value, i.e. if it is kept substantially identical from one device to the other.

In fact, this last feature has the corollary that all the meters of the same manufacturing batch which are tested on the same bench have ratios (R1+R2)/(R3+R4) which are very close and ideally identical, and this contributes to ensuring that all the meters under test receive exactly the same voltage and current signals.

We claim:

1. An electrical measuring device comprising:
   at least first and second connection terminals, in a number at least equal to N+1, N being an integer at least equal to 1, and whose potentials define, in operation, at least N control voltages,;
   an electronic measuring circuit comprising at least first and second input terminals in a number at least equal to N+1 and whose potentials define for the circuit, in operation, at least N counterpart voltages representing the corresponding control voltages, wherein said circuit uses reference potential linked to the potential of the first connection terminal;
   a first voltage divider (R1, R2) between the first and second connection terminals, with a first intermediate point connected to the second input terminal of the measuring circuit, and providing a determined voltage ratio, further to said connection terminals, an additional connection terminal, adapted to be raised selectively to the potential of the first connection terminal or to a different potential, further to said input terminals, an additional input terminal co-operating with the second input terminal of the measuring circuit to form a differential input for said measuring circuit and a second voltage divider (R3, R4) between the first connection terminal and the additional connection terminal, with a second intermediate point connected to the additional input terminal of the measuring circuit and providing a voltage ration substantially equal to the ratio provided by the first voltage divider, the counterpart voltage defined between the second input terminal and the additional input terminal thus being substantially representative of the control voltage between the second connection terminal and the additional connection terminal, whether this is raised to the same potential as the first connection terminal or not.

2. A device according to claim 1, wherein at least two connection terminals, including the first connection terminal but not the additional connection terminal, define at least one voltage representative of the current flowing in a shunt, and wherein, in order to power the measuring circuit from the power available between at least two of the connection terminals, the device includes a power supply transformer whose primary is connected between the additional connection terminal and the second connection terminal and whose secondary is connected by a DC connection to the first connection terminal.

3. A device according to claim 1, wherein the measuring circuit is a circuit measuring electrical energy or power.

4. A device according to claim 1, connected in an electrical power network comprising at least one phase conductor and a neutral conductor, wherein the first and second connection terminals are raised respectively to the potentials of the phase and neutral conductors.

5. A device according to claim 2, comprising a third connection terminal and wherein the connection terminals raised to potentials whose difference represents the current flowing in the shunt are the first and third terminals.

6. A device according to claim 1, wherein the series impedance (R1+R2) of the first voltage divider is not less than 500 kohms.

7. A device according to claim 1, wherein the ratio ((R1+R2)/(R3+R4)) of the series impedance of the first voltage divider and that of the second voltage divider is at least equal to one.

8. A device according to claim 7, wherein said ratio of series impedance has a fixed, predetermined value.

* * * * *